(12) United States Patent
Zhang

(10) Patent No.: US 11,433,419 B2
(45) Date of Patent: Sep. 6, 2022

(54) DRAW DEVICE, DRAW EQUIPMENT, AND COATING SYSTEM

(71) Applicant: TCL China Star Optoelectronics Technology Co., Ltd., Shenzhen (CN)

(72) Inventor: Chong Zhang, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 203 days.

(21) Appl. No.: 16/623,408

(22) PCT Filed: Dec. 9, 2019

(86) PCT No.: PCT/CN2019/123987
§ 371 (c)(1),
(2) Date: Dec. 17, 2019

(87) PCT Pub. No.: WO2021/103127
PCT Pub. Date: Jun. 3, 2021

(65) Prior Publication Data
US 2021/0323021 A1    Oct. 21, 2021

(30) Foreign Application Priority Data
Nov. 27, 2019   (CN) .......................... 201911182871.9

(51) Int. Cl.
*B05C 11/10*  (2006.01)
*B05C 5/02*   (2006.01)

(52) U.S. Cl.
CPC ........ *B05C 11/1002* (2013.01); *B05C 5/0254* (2013.01)

(58) Field of Classification Search
None
See application file for complete search history.

(56) References Cited

U.S. PATENT DOCUMENTS

| 9,744,545 B2 * | 8/2017 | Rhea ...................... B05B 9/0816 |
| 10,265,708 B2 * | 4/2019 | Rhea ...................... F16K 7/066 |
| 2007/0102044 A1 | 5/2007 | Patzek, IV |
| 2007/0113893 A1 | 5/2007 | Sun |

FOREIGN PATENT DOCUMENTS

| CN | 1805190 | 7/2006 |
| CN | 201300104 | 9/2009 |
| CN | 203044232 | 7/2013 |
| CN | 107583830 | 1/2018 |
| CN | 209100363 | 7/2019 |
| TW | I339704 | 4/2011 |

* cited by examiner

Primary Examiner — Jethro M. Pence

(57) ABSTRACT

The present invention provides a draw device. The draw device includes a draw head, a draw opening, a draw tube, at least one pressure hole, and at least one flow guiding channel. The at least one flow guiding channel is respectively arranged corresponding to the at least one pressure hole. Each flow guiding channel communicates with the corresponding pressure hole to take out a drawn liquid inside the pressure hole.

17 Claims, 4 Drawing Sheets

DRAW DEVICE, DRAW EQUIPMENT, AND COATING SYSTEM

RELATED APPLICATIONS

This application is a National Phase of PCT Patent Application No. PCT/CN2019/123987 having International filing date of Dec. 9, 2019, which claims the benefit of priority of Chinese Patent Application No. 201911182871.9 filed on Nov. 27, 2019. The contents of the above applications are all incorporated by reference as if fully set forth herein in their entirety.

FIELD AND BACKGROUND OF DISCLOSURE

The present invention relates to a field of display panel manufacture and in particular, to a draw device, a draw equipment, and a coating system.

In the field of thin film transistor liquid crystal displays (TFT-LCD), using a coating equipment for a coating process is a very important and indispensable basic procedure. The coating quality directly affects the results of subsequent processes.

At present, in the field of semiconductor display technology, the coating equipment is mainly composed of a photoresist material, a draw pipe, and other components in combination with slits to perform the coating process. The photoresist draw pipe is used for a long time, and there may be some contamination to cause clogging or damages, which often leads to abnormal pressure releases during the coating process. One of the reasons for this problem is that the photoresist material easily enters a compress dry air (CDA) hole in a photoresist connector, which easily causes the CDA hole to be clogged by a cured photoresist material.

In view of such problems, the CDA hole in the photoresist connector has to be cleaned mainly through monthly maintenance on the production line. Such a method is currently the most commonly used cleaning method, but it cannot completely solve the problem that the CDA hole is clogged by the photoresist material. This method also consumes manpower and resources.

In conventional photoresist draw devices, a photoresist material easily enters a compress dry air (CDA) hole. The CDA hole is clogged by a cured photoresist material, which leads to abnormal pressure releases during a work process and affects manufacturing processes.

SUMMARY OF THE INVENTION

It is an objective of the present invention to provide a draw device, a draw equipment, and a coating system to remove a drawn liquid in a pressure hole of the draw device to thereby solve problems of conventional techniques that the pressure hole is clogged by a cured drawn liquid.

To solve the above problem, the present invention provides technical solutions as follows:

The present invention provides a draw device comprises:
a draw head;
a draw opening defined in the draw head and extended through the draw head;
a draw tube communicating with the draw opening;
at least one pressure hole defined in the draw head and extended through the draw head; and
at least one flow guiding channel, wherein the at least one flow guiding channel is respectively disposed corresponding to the at least one pressure hole in a one-to-one relationship, each flow guiding channel and the corresponding pressure hole are defined in the draw head on one side thereof adjacent to the draw tube, and each pressure hole communicates with the corresponding flow guiding channel.

According to one embodiment of the present invention, a groove is defined in the draw head on one side thereof toward the draw tube, and each pressure hole communicates with the groove through the corresponding flow guiding channel.

According to one embodiment of the present invention, the groove is a ring-shaped groove surrounding the draw opening and the at least one pressure hole.

According to one embodiment of the present invention, a height of each flow guiding channel is less than a depth of the groove, and a width of the flow guiding channel is less than or equal to a diameter of the corresponding pressure hole.

According to one embodiment of the present invention, a height of the flow guiding channel is less than or equal to one millimeter (mm).

According to one embodiment of the present invention, a number of the at least one pressure hole is two, and the two pressure holes are symmetrically arranged at two sides of the draw opening.

According to one embodiment of the present invention, one side of the draw device facing away from the draw tube is provided with at least one air guiding tube respectively disposed corresponding to the at least one pressure hole, each pressure hole communicates with the corresponding air guiding tube, and each air guiding tube is used to supply dry compressed air into the corresponding pressure hole.

According to one embodiment of the present invention, one side of the draw head facing away from the draw tube is provided with an exhaust tube communicating with the draw opening, and the exhaust tube is for discharging a drawn liquid.

Accordingly, the present invention provides a draw equipment, the draw equipment comprising a sealed device for storing a drawn liquid and also comprising a draw device, wherein the draw device comprises:
a draw head;
a draw opening defined in the draw head and extended through the draw head;
a draw tube communicating with the draw opening;
at least one pressure hole defined in the draw head and extended through the draw head; and
at least one flow guiding channel, wherein the at least one flow guiding channel is respectively disposed corresponding to the at least one pressure hole in a one-to-one relationship, the flow guiding channel and the corresponding pressure hole are defined in the draw head on one side thereof adjacent to the draw tube, and each pressure hole communicates with the corresponding flow guiding channel;
wherein an open hole matching a size and a shape of the draw head is defined in the sealed device;
wherein the draw head is disposed in the open hole, the draw tube is disposed in the sealed device through the open hole, and the pressure hole communicates with the sealed device through the open hole.

According to one embodiment of the present invention, a groove is defined in the draw head on one side thereof toward the draw tube, and each pressure hole communicates with the groove through the corresponding flow guiding channel.

According to one embodiment of the present invention, the groove is a ring-shaped groove surrounding the draw opening and the at least one pressure hole.

According to one embodiment of the present invention, a height of each flow guiding channel is less than a depth of the groove, and a width of the flow guiding channel is less than or equal to a diameter of the corresponding pressure hole.

According to one embodiment of the present invention, a height of the flow guiding channel is less than or equal to one millimeter (mm).

According to one embodiment of the present invention, a number of the at least one pressure hole is two, and the two pressure holes are symmetrically arranged at two sides of the draw opening.

According to one embodiment of the present invention, one side of the draw device facing away from the draw tube is provided with at least one air guiding tube respectively disposed corresponding to the at least one pressure hole, each pressure hole communicates with the corresponding air guiding tube, and each air guiding tube is used to supply dry compressed air into the corresponding pressure hole.

According to one embodiment of the present invention, one side of the draw head facing away from the draw tube is provided with an exhaust tube communicating with the draw opening, and the exhaust tube is for discharging a drawn liquid.

Accordingly, the present invention provides a coating system, comprising:

a coating device and a draw equipment, wherein the coating device communicates with the draw equipment for obtaining a drawn liquid from the draw equipment to coat a substrate; the draw equipment comprises:

a sealed device for storing a drawn liquid and a draw device, wherein the draw device comprises:

a draw head;

a draw opening defined in the draw head and extended through the draw head;

a draw tube communicating with the draw opening;

at least one pressure hole defined in the draw head and extended through the draw head; and at least one flow guiding channel, wherein the at least one flow guiding channel is respectively disposed corresponding to the at least one pressure hole in a one-to-one relationship, the flow guiding channel and the corresponding pressure hole are defined in the draw head on one side thereof adjacent to the draw tube, and each pressure hole communicates with the corresponding flow guiding channel;

wherein an open hole matching a size and a shape of the draw head is defined in the sealed device;

wherein the draw head is disposed in the open hole, the draw tube is disposed in the sealed device through the open hole, and the pressure hole communicates with the sealed device through the open hole.

According to one embodiment of the present invention, a groove is defined in the draw head on one side thereof toward the draw tube, and each pressure hole communicates with the groove through the corresponding flow guiding channel.

According to one embodiment of the present invention, one side of the draw device facing away from the draw tube is provided with at least one air guiding tube respectively disposed corresponding to the at least one pressure hole, each pressure hole communicates with the corresponding air guiding tube, and each air guiding tube is used to supply dry compressed air into the corresponding pressure hole.

According to one embodiment of the present invention, one side of the draw head facing away from the draw tube is provided with an exhaust tube communicating with the draw opening, and the exhaust tube is for discharging a drawn liquid.

Advantages of the present invention: Compared with conventional techniques, the draw device of the present invention solves the above problem by using the flow guiding channel defined on an edge of the pressure hole, so as to take out the drawn liquid in the pressure hole, thereby effectively preventing the pressure hole from being clogged, reducing the risk of abnormal pressure releases during operations, reducing downtime, and increasing throughput.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work.

DESCRIPTION OF SPECIFIC EMBODIMENTS OF THE INVENTION

Figure 1:
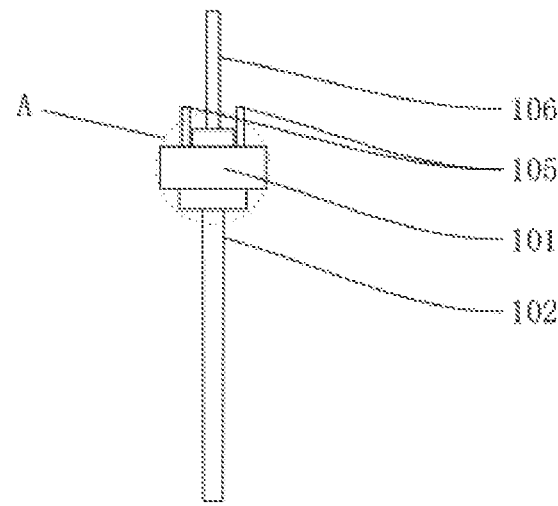
FIG. 1 is a schematic structural view illustrating a draw device according to one embodiment of the present invention.

Embodiments of the present invention are described below with reference to the accompanying drawings. The directional terms in the present disclosure, such as "upper", "lower", "front", "rear", "left", "right", "inside", "outside", and "lateral", are merely illustrative with reference to the accompanying drawings, and are not intended to limit the protection scope of the present invention. In the drawings, the same reference numerals in the drawings denote the same components.

The present invention is directed to solving the problem in a conventional draw device that a drawn liquid in a pressure hole is cured, and the cured drawn liquid causes clogging of the pressure hole. The present invention provides a draw device, a draw equipment, and a coating system to solve the above problem.

Figure 2:
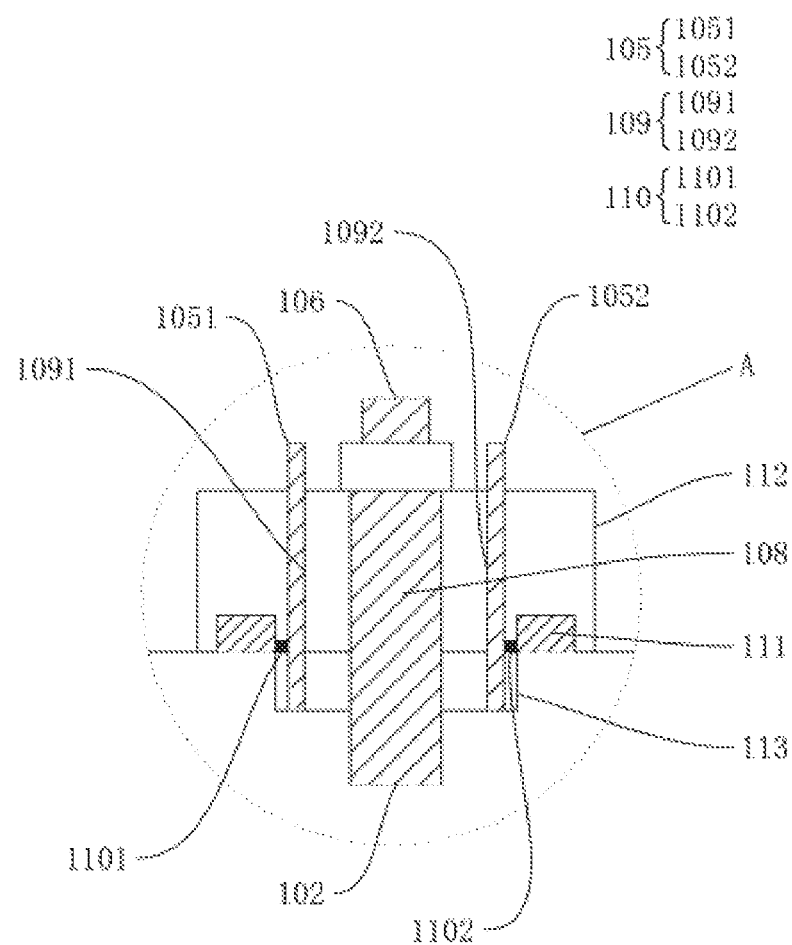
FIG. 2 is a cross-sectional view illustrating an internal structure of the draw device according to one embodiment of the present invention.

Please refer to FIGS. 1 and 2 which are schematic structural views illustrating a draw device of the present invention. The draw device 10 comprises a draw head 101, a draw opening 108, a draw tube 102, at least one pressure hole 109, and at least one flow guiding channel 110.

The draw opening 108 is defined in the draw head 101 and extended through the draw head 101. In addition, the draw tube 102 is disposed on one side of the draw head 101 and is in communication with the draw opening 108.

At least one pressure hole 109 is defined in the draw head 101 and extended through the draw head 101. The at least one pressure hole 109 is disposed away from the draw opening 108.

The at least one flow guiding channel 110 is defined in the draw head 101 on one side thereof adjacent to the draw tube 102. The at least one flow guiding channel 110 is respectively disposed corresponding to the at least one pressure hole 109 in a one-to-one relationship. Each flow guiding channel 110 communicates with the corresponding pressure hole 109.

When the draw device 10 is used in practical applications, the draw device 10 is disposed at an opening of a device in which a drawn liquid is stored, and pressurizes the device through the pressure hole 109. When a pressure reaches a predetermined value, the drawn liquid is pressed into the draw tube 102 to be discharged to the outside through the draw opening 108. It should be noted that, when the drawn liquid stored in the device is too full, the drawn liquid easily flows back to the pressure hole 109. When the drawn liquid is cured, the pressure hole 109 is clogged. The flow guiding channel 110 can guide out the drawn liquid in the pressure hole 109 in time, thereby effectively preventing the drawn liquid from clogging the pressure hole 109.

Figure 3:
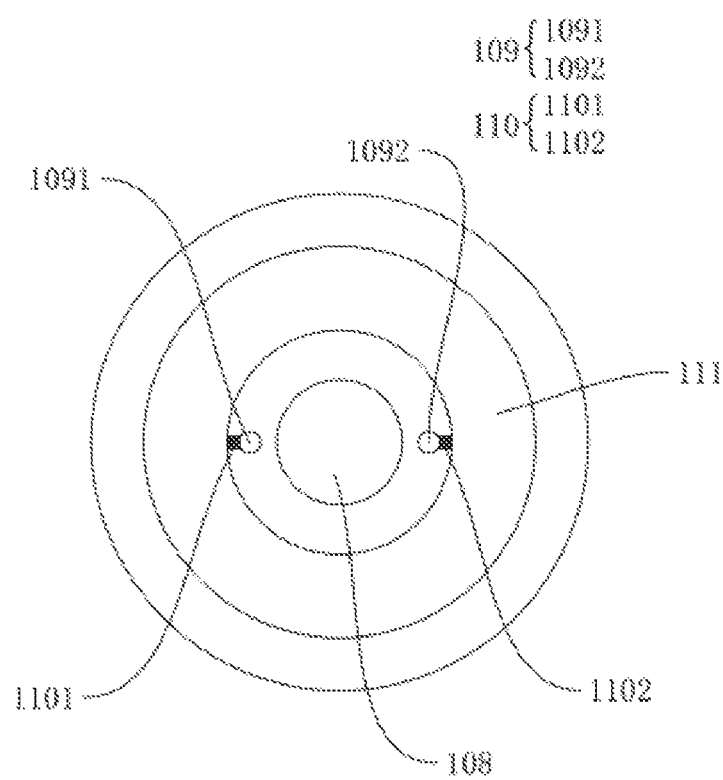
FIG. 3 is a cross-sectional view illustrating the draw device, taken from one side toward a draw tube, according to one embodiment of the present invention.

Furthermore, as shown in FIGS. 2 and 3, in the present embodiment, a groove 111 is defined in the draw head 101 on one side thereof toward the draw tube 102, and the groove 111 can be a ring-shaped groove surrounding the draw opening 108 and the at least one pressure hole 109. Each pressure hole 109 communicates with the groove 111 through the corresponding flow guiding channel 110.

In the present embodiment, a height of each flow guiding channel 110 is less than a depth of the groove 111, and the height of each flow guiding channel 110 is greater than or equal to one millimeter (mm).

When the height of the flow guiding channel 110 is too tall, air pressure leakage of the pressure hole 109 through the inside of the flow guiding channel 110 is also higher, thereby affecting sealing quality of the draw head 101.

A width of the flow guiding channel 110 is less than or equal to a diameter of the corresponding pressure hole 109. When the width of the flow guiding channel 110 is too wide, the drawn liquid is left at an edge of the pressure hole 109, thereby partially obstructing the flow guiding channel 110.

In addition, the present embodiment has two pressure holes 109. The two pressure holes 109 are a first pressure hole 1091 and a second pressure hole 1092, and the first pressure hole 1091 and the second pressure hole 1092 are symmetrically arranged at two sides of the draw opening 108.

Moreover, a first guiding channel 1101 and a second guiding channel 1102 are disposed corresponding to the pressure holes 109. The first pressure hole 1091 communicates with the groove 111 through the first guiding channel 1101. The second pressure hole 1092 communicates with the groove 111 through the second guiding channel 1102.

In other words, the first guiding channel 1101 and the second guiding channel 1102 respectively communicate with the first pressure hole 1091 and the second pressure hole 1092 to ensure smooth flow of liquid, thereby ensuring operational performance of the draw device 10.

Moreover, one side of the draw device 101 facing away from the draw tube 102 is provided with at least one air guiding tube 105 respectively disposed corresponding to the at least one pressure hole 109 for supplying dry compressed air into the pressure hole 109.

In the present embodiment, the at least one air guiding tube 105 includes a first air guiding tube 1051 and a second air guiding tube 1052. The first air guiding tube 1051 is used to supply dry compressed air to the first pressure hole 1091, and the second air guiding tube 1052 is used to supply dry compressed air to the second pressure hole 1092.

One side of the draw head 101 facing away from the draw tube 102 is provided with an exhaust tube 106 communicating with the draw opening 108, and the exhaust tube 106 is used for discharging the drawn liquid.

In the present embodiment, as shown in FIGS. 2 and 3, the draw head 101 is an assembling design and includes a top connection head 112 and a bottom connection head 113. The top connection head 112 is connected to the bottom connection head 113, and the draw tube 102 is connected to one side of the bottom connection head 113 facing away from the top connection head 112.

In addition, the pressure hole 109 and the draw opening 108 are extended through the top connection head 112 and the bottom connection head 113.

In the present embodiment, the flow guiding channel 110 is defined in one side of the top connection head 112 facing the bottom connection head 113. The flow guiding channel 110 is a recess defined in the top connection head 112, and the recess is open toward the bottom connection head 113. After the top connection head 112 and the bottom connection head 113 are connected to each other, the recess is sealed by the bottom connection head 113 and forms the flow guiding channel 110 at the same time. The flow guiding channel 110 enables the pressure hole 109 to communicate with the groove 111.

Figure 4:
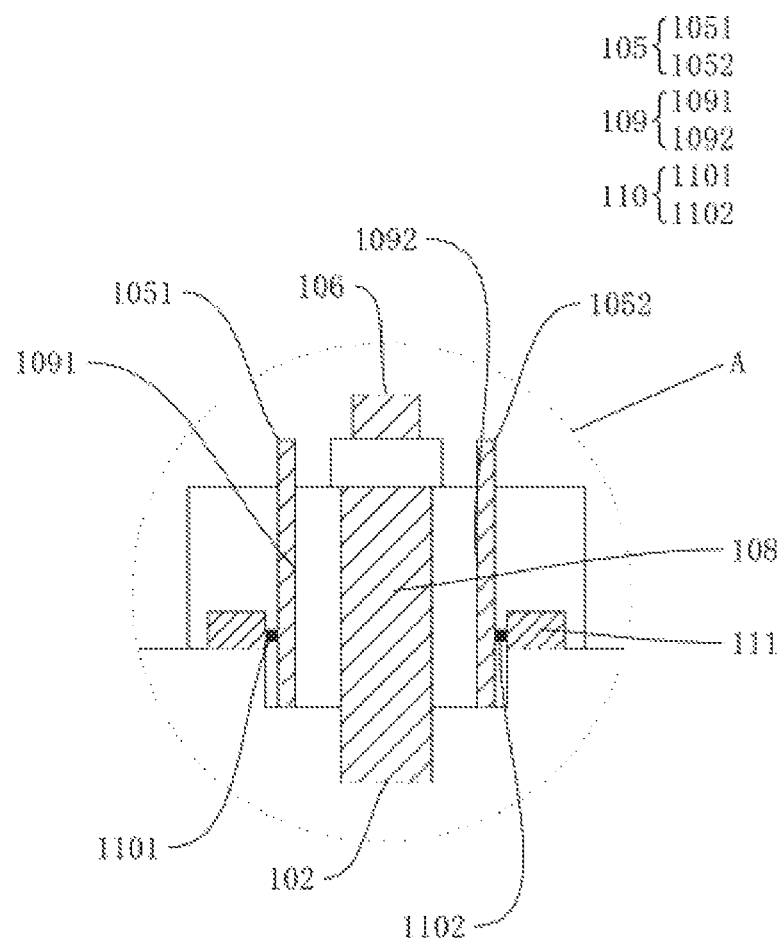
FIG. 4 is a cross-sectional view illustrating an internal structure of the draw device according to another embodiment of the present invention.

Moreover, according to another embodiment of the present invention, the draw head 101 is an integral design. As shown in FIG. 4. the difference between the draw head in the present embodiment and the above-mentioned draw head lies in that, the draw head 101 is an integral design. In other words, the flow guiding channel 110 is arranged by a side wall of the groove 111 adjacent to the draw opening 108, and the flow guiding channel 110 is a through hole and communicates with the pressure hole 109 and the groove 111.

According to the present embodiment, a diameter of the flow guiding channel 110 is less than a depth of the groove 111. The diameter of the flow guiding channel 110 is less than or equal to a diameter of the pressure hole 109. The diameter of the flow guiding channel 110 is less than or equal to one mm.

Similarly, when the diameter of the flow guiding channel 110 is too large, the sealing effect of the draw head is compromised, and the flow guiding channel 110 has a reduced effect on ensuring a smooth flow of liquid in the pressure hole 109.

To sum up, the draw device 10 pressurizes the device in which the drawn liquid is stored through the air guiding tube 105 and the pressure hole 109, and the drawn liquid is pressed into the draw tube 102 and discharged through the draw opening 108 and the exhaust tube 106. At the same time, the flow guiding channel 110 can timely take out the drawn liquid flows into in the pressure hole 109 to prevent the pressure hole 109 from being clogged due to the curing of the drawn liquid, thereby ensuring normal operation of the draw device 10.

Figure 5:
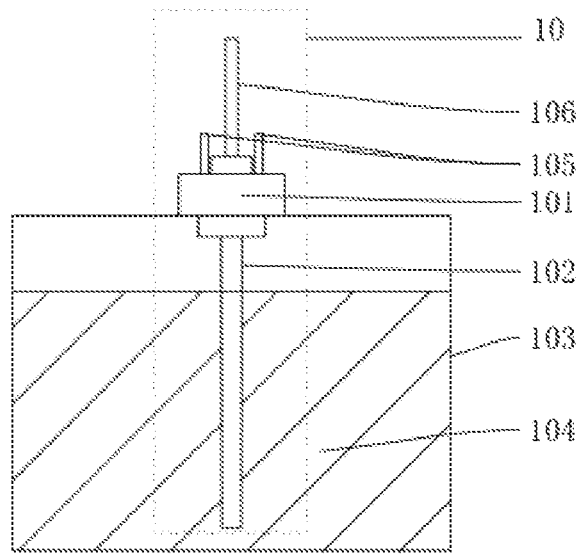
FIG. 5 is a schematic structural view illustrating a draw equipment according to one embodiment of the present invention.

The present invention further provides a draw equipment. As shown in FIG. 5, the draw equipment comprises a sealed device 103 containing a drawn liquid and the draw device 10 of the above embodiment.

According to the present embodiment, an open hole is defined in the sealed device 103. The draw head 101 is disposed at the open hole. One side of the draw head 101 provided with the draw tube 102 faces toward the inside of the sealed device 103, the draw tube 102 is disposed inside the sealed device 103 through the open hole, and the at least one pressure hole 109 also communicates with the sealed device 103 through the open hole. One side of the draw head 101 provided with the air guiding tube 105 and the exhaust tube 106 is disposed toward the outside of the sealed device 103.

Moreover, where the draw head 101 and the sealed device 103 are connected has a sealed design, so that the pressure hole 109 can pressurize the sealed device 103 successfully.

According to one embodiment of the present invention, as shown in FIGS. 1, 2 and 3, the draw head 101 is an assembling design and comprises a top connection head 112 and a bottom connection head 113. The top connection head 112 and the bottom connection head 113 have the same connection structure as the assembling design in the above embodiment. The top connection head 112 is disposed at the open hole of the sealed device 103 and toward the outside of the sealed device 103. The bottom connection head 113 is disposed at the opening and toward the inside of the sealed device 103. The top connection head 112 and the bottom connection head 113 are connected to each other at the open hole. The draw tube 102 is connected to one side of the bottom connection head 113 facing toward the inside of the sealed device 103, and the connection produces a sealing effect there.

According to another embodiment of the present invention, as shown in FIGS. 1 and 4, the draw head 101 is an integral design, and the integral design of the draw head 101 is the same as the integral design in the above embodiment. Similarly, the draw head 101 is directly sealed at the open hole of the sealed device 103 and is connected to the draw tube 102 on one side of the draw head 101 facing the inside of the sealed device 103.

In summary, when the draw equipment is in operation, dry compressed air is sent into the sealed device 103 through the pressure hole 109. When the pressure in the sealed device 103 reaches a predetermined value, the drawn liquid 104 is pressed into the draw tube 102 and enters the exhaust tube 106 through the draw opening 108 to discharge the drawn liquid 104.

However, when the drawn liquid 104 contained in the sealed device 103 is too full, the drawn liquid 104 easily flows into the pressure hole 109, and the drawn liquid 104 is likely to clog the pressure hole 109 after the drawn liquid 104 is cured, and as a result, the drawn liquid 104 cannot be drawn out normally.

In the present embodiment, the drawn liquid 104 can be guided out in time by means of the flow guiding channel 110, thus effectively preventing the pressure hole 109 from being clogged and also ensuring normal operation of the draw equipment when a drawing process is performed.

Figure 6:
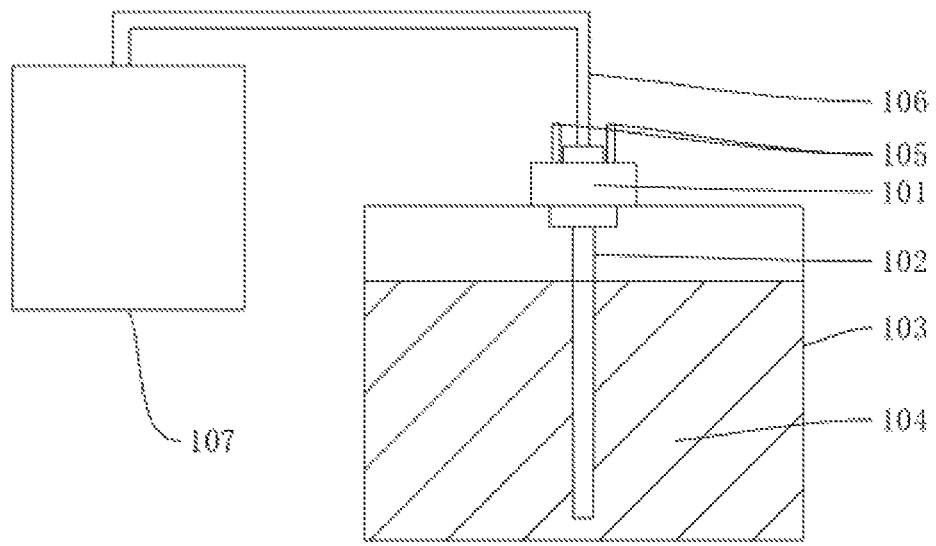
FIG. 6 is a schematic structural view illustrating a coating system according to one embodiment of the present invention.

The present invention further provides a coating system. As shown in FIG. 6, the coating system comprises a coating device 107 and a draw equipment in the above embodiment. In the present embodiment, the coating device 107 communicates with the draw equipment. In other words, the coating device 107 communicates with the exhaust tube 106. The coating device 107 obtains a drawn liquid 104 through the draw equipment to coat a substrate in a manufacturing process.

In addition, the coating equipment 107 includes a machine table and a nozzle which can be the same as those in conventional techniques; the present invention is not limited in this regard.

It should be noted that, if the drawn liquid 104 enters the pressure hole 109 and causes the pressure hole 109 to be clogged when the coating system is in operation, an abnormal pressure release of the sealed device 103 occurs, which causes the coating device 107 to be abnormally shut down.

In the present embodiment, the drawn liquid 104 in the pressure hole 109 can be guided out in time through the flow guiding channel 110, which ensures that the coating device 107 can smoothly obtain the drawn liquid 104, reduces abnormal downtime, and increases throughput.

Although the present invention has been disclosed above with reference to preferable embodiments, the preferable embodiments are not intended to limit the protection scope of the present invention. Those skilled in the art can make various modifications without departing from the spirit and protection scope of the present invention. The protection scope of the present invention is defined by the appended claims.

What is claimed is:

1. A draw device, comprising:
   a draw head;
   a draw opening defined in the draw head and extended through the draw head;
   a draw tube communicating with the draw opening;
   at least one pressure hole defined in the draw head and extended through the draw head,
   wherein the at least one pressure hole is exposed from a bottom side of the draw head;
   at least one flow guiding channel; and
   a groove positioned within the draw head, wherein each of the at least one pressure hole communicates with the groove through a corresponding flow guiding channel, wherein the at least one flow guiding channel is respectively disposed corresponding to the at least one pressure hole in a one-to-one relationship, each of the at least one flow guiding channel and a corresponding pressure hole are positioned inside the draw head on one side thereof adjacent to the draw tube, and each of the at least one pressure hole communicates with the corresponding flow guiding channel.

2. The draw device according to claim 1, wherein the groove is a ring-shaped groove surrounding the draw opening and the at least one pressure hole.

3. The draw device according to claim 2, wherein a height of each of the at least one flow guiding channel is less than a depth of the groove, and a width of each of the at least one flow guiding channel is less than or equal to an internal diameter of the corresponding pressure hole.

4. The draw device according to claim 3, wherein a height of each of the at least one flow guiding channel is less than or equal to one millimeter (mm).

5. The draw device according to claim 1, wherein a number of the at least one pressure hole is two, and the two pressure holes are symmetrically arranged at two sides of the draw opening.

6. The draw device according to claim 1, wherein one side of the draw device facing away from the draw tube is provided with at least one air guiding tube respectively disposed corresponding to the at least one pressure hole, each of the at least one pressure hole communicates with a corresponding air guiding tube, and each of the at least one air guiding tube is used to supply dry compressed air into the corresponding pressure hole.

7. The draw device according to claim 1, wherein one side of the draw head facing away from the draw tube is provided with an exhaust tube communicating with the draw opening, and the exhaust tube is for discharging a drawn liquid.

8. A draw equipment, the draw equipment comprising a sealed device for storing a drawn liquid and also comprising a draw device, wherein the draw device comprises:
   a draw head;
   a draw opening defined in the draw head and extended through the draw head;
   a draw tube communicating with the draw opening;
   at least one pressure hole defined in the draw head and extended through the draw head, wherein the at least one pressure hole is exposed from a bottom side of the draw head;
   at least one flow guiding channel; and
   a groove positioned within the draw head, wherein each of the at least one pressure hole communicates with the groove through a corresponding flow guiding channel, wherein the at least one flow guiding channel is respectively disposed corresponding to the at least one pressure hole in a one-to-one relationship, each of the at least one flow guiding channel and a corresponding pressure hole are positioned inside the draw head on one side thereof adjacent to the draw tube, and each of the at least one pressure hole communicates with the corresponding flow guiding channel;
   wherein an open hole matching a size and a shape of the draw head is defined in the sealed device; and
   wherein the draw head is disposed in the open hole, the draw tube is disposed in the sealed device through the open hole, and the at least one pressure hole communicates with the sealed device through the open hole.

9. The draw equipment according to claim 8, wherein the groove is a ring-shaped groove surrounding the draw opening and the at least one pressure hole.

10. The draw equipment according to claim 9, wherein a height of each of the at least one flow guiding channel is less than a depth of the groove, and a width of each of the at least one flow guiding channel is less than or equal to an internal diameter of the corresponding pressure hole.

11. The draw equipment according to claim 10, wherein a height of each of the at least one the flow guiding channel is less than or equal to one millimeter (mm).

12. The draw equipment according to claim 8, wherein a number of the at least one pressure hole is two, and the two pressure holes are symmetrically arranged at two sides of the draw opening.

13. The draw equipment according to claim 9, wherein one side of the draw device facing away from the draw tube is provided with at least one air guiding tube respectively disposed corresponding to the at least one pressure hole, each of the at least one pressure hole communicates with a corresponding air guiding tube, and each of the at least one air guiding tube is used to supply dry compressed air into the corresponding pressure hole.

14. The draw equipment according to claim 8, wherein one side of the draw head facing away from the draw tube is provided with an exhaust tube communicating with the draw opening, and the exhaust tube is for discharging the drawn liquid.

15. A coating system, comprising:
   a coating device and a draw equipment, wherein the coating device communicates with the draw equipment for obtaining a drawn liquid from the draw equipment to coat a substrate; the draw equipment comprises:
   a sealed device for storing the drawn liquid and a draw device, wherein the draw device comprises:
   a draw head;
   a draw opening defined in the draw head and extended through the draw head;
   a draw tube communicating with the draw opening;
   at least one pressure hole defined in the draw head and extended through the draw head, wherein the at least one pressure hole is exposed from a bottom side of the draw head;
   at least one flow guiding channel; and
   a groove positioned within the draw head, wherein each of the at least one pressure hole communicates with the groove through a corresponding flow guiding channel, wherein the at least one flow guiding channel is respectively disposed corresponding to the at least one pressure hole in a one-to-one relationship, the at least one flow guiding channel and a corresponding pressure hole are positioned inside the draw head on one side thereof adjacent to the draw tube, and each of the at least one pressure hole communicates with the corresponding flow guiding channel;
   wherein an open hole matching a size and a shape of the draw head is defined in the sealed device; and
   wherein the draw head is disposed in the open hole, the draw tube is disposed in the sealed device through the open hole, and the at least one pressure hole communicates with the sealed device through the open hole.

16. The coating system according to claim 15, wherein one side of the draw device facing away from the draw tube is provided with at least one air guiding tube respectively disposed corresponding to the at least one pressure hole, each of the at least one pressure hole communicates with a corresponding air guiding tube, and each of the at least one air guiding tube is used to supply dry compressed air into the corresponding pressure hole.

17. The coating system according to claim 15, wherein one side of the draw head facing away from the draw tube is provided with an exhaust tube communicating with the draw opening, and the exhaust tube is for discharging the drawn liquid.

* * * * *